United States Patent
Buer et al.

(10) Patent No.: US 8,040,748 B2
(45) Date of Patent: *Oct. 18, 2011

(54) QUAD SRAM BASED ONE TIME PROGRAMMABLE MEMORY

(75) Inventors: Myron Buer, Gilbert, AZ (US); Jonathan Schmitt, Eden Prairie, MN (US); Laurentiu Vasiliu, San Diego, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/568,430

(22) Filed: Sep. 28, 2009

(65) Prior Publication Data

US 2010/0014340 A1 Jan. 21, 2010

Related U.S. Application Data

(63) Continuation of application No. 11/933,073, filed on Oct. 31, 2007, now Pat. No. 7,609,578.

(51) Int. Cl.
*G11C 7/00* (2006.01)

(52) U.S. Cl. ............ 365/225.7; 365/189.05; 365/189.11
(58) Field of Classification Search ............... 365/225.7, 365/189.05, 189.11
See application file for complete search history.

(56) References Cited

U.S. PATENT DOCUMENTS

| | | | |
|---|---|---|---|
| 5,467,304 A * | 11/1995 | Uchida et al. | 365/174 |
| 7,098,721 B2 * | 8/2006 | Ouellette et al. | 327/525 |
| 7,154,800 B2 * | 12/2006 | Imondi | 365/225.7 |

* cited by examiner

*Primary Examiner* — Son T Dinh
(74) *Attorney, Agent, or Firm* — Sterne, Kessler, Goldstein & Fox P.L.L.C.

(57) ABSTRACT

A differential latch-based one time programmable memory cell is provided. The differential latch-based one time programmable memory cell includes a differential latching amplifier having a first set of fuse devices coupled to the first input and a second set of fuse devices coupled to the second input. Only one set of fuse devices can be programmed in a memory cell. If one or more fuse devices in a set of fuse devices are programmed, the side having the programmed fuse will present a lower voltage at its input to the differential latching amplifier. Differential latching amplifier outputs a "0" or a "1" depending on the side having the programmed fuse.

20 Claims, 4 Drawing Sheets

QUAD SRAM BASED ONE TIME PROGRAMMABLE MEMORY

CROSS REFERENCE TO RELATED APPLICATIONS

This application is a continuation of U.S. patent application Ser. No. 11/933,073, filed on Oct. 31, 2007, now U.S. Pat. No. 7,609,578, titled "Quad SRAM Based One Time Programmable Memory".

FIELD OF THE INVENTION

The present invention relates generally to one time programmable memory cells.

BACKGROUND OF THE INVENTION

Two types of memory devices are commonly used in the field of data storage. The first type is volatile memory in which stored information is lost when power is removed. The second type is non-volatile memory in which the information is preserved after the power is removed. Non-volatile memory may be designed for multiple programming or for one-time programming. Examples of multiple programmable non-volatile memory include electrically erasable programmable read only memories (EEPROMs) and flash memory. Unlike a multiple programmable memory, a one-time programmable non-volatile memory can be programmed only once. The programming typically involves the "blowing" of a fuse element of the cell. The programming of a one-time programmable memory is irreversible.

One type of existing one-time programmable memory is a single-ended latch-based memory. In the existing single-ended latch-based memory, a latching amplifier compares a reference voltage, typically set to a percentage of the supply voltage, against a fuse with a current source. If the fuse is not programmed, the current source drives the voltage on the fuse to the supply voltage and the latching amplifier outputs a "0." If the fuse is programmed, the fuse sinks the current and the voltage level goes to ground, causing the latching amplifier to output a "1." Because the reference is a percentage of the supply voltage, the read margin of the single-ended latch-based memory cells is reduced resulting in reduced yield and manufacturability for these memory cells.

Furthermore, many modern applications require the secure storage of large amounts of data in non-volatile memories. Because of the nature of the information required in these secure applications, the ability to output a random value on power-up is critical. Because the unprogrammed output of the single-ended latch based memory cells is set to a default value, the use of these memory cells in certain secure applications may not be appropriate.

What is therefore needed is a latch-based one time programmable memory cell with increased read margin, yield, and manufacturability.

What is further needed is a secure latch-based one time programmable memory cell providing random output during power up.

BRIEF DESCRIPTION OF THE DRAWINGS

The accompanying drawings, which are incorporated herein and form a part of the specification, illustrate the present invention and, together with the description, further serve to explain the principles of the invention and to enable a person skilled in the pertinent art to make and use the invention.

Figure 1:
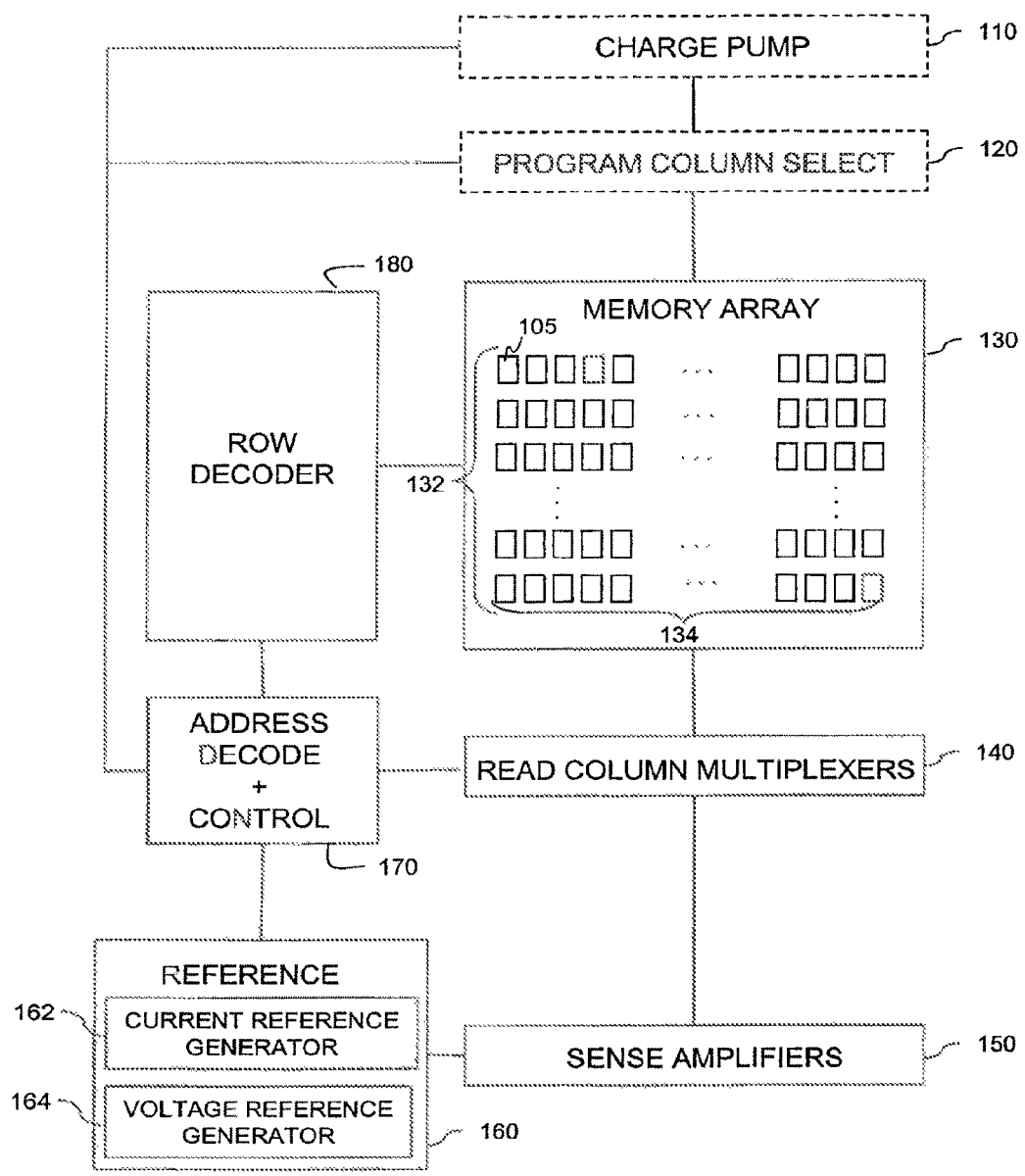
FIG. 1 depicts a high density OTP memory device, according to embodiments of the present invention.

The present invention will now be described with reference to the accompanying drawings. In the drawings, like reference numbers can indicate identical or functionally similar elements. Additionally, the left-most digit(s) of a reference number may identify the drawing in which the reference number first appears.

DETAILED DESCRIPTION OF THE INVENTION

1. One Time Programmable Memory Device

FIG. 1 depicts an exemplary one time programmable (OTP) memory device 100, according to embodiments of the present invention. Memory device 100 includes a memory array 130, an address decoder and control block 170, a row decoder 180, an optional program column select block 120, an optional charge pump 110, optional read column multiplexers 140, reference block 160, and one or more sense amplifiers 150.

Memory array 130 includes one or more differential latch based OTP memory cells 105. Differential latch based OTP memory cells 105 are described in further detail in Section 2 below. When multiple OTP memory cells 105 are present in memory array 130, the OTP memory cells 105 may be arranged in a plurality of rows 132 and columns 134 forming an array. In this arrangement, memory array 130 comprises a total of "n" rows and "m" columns, where m may be greater than, equal to or less than n. A column of memory cells shares a single bit line. A row 132 of memory cells may also share a common row select line.

SRAM read/write module 110 is configured to read data from or write data to one or more SRAM-OTP memory cells 105 prior to OTP programming (referred to herein as "pre-programming"). In an embodiment, SRAM read/write module 110 is also applied to read a programmed SRAM-OTP memory cell. In this embodiment, SRAM read/write module 110 may include an NMOS pass transistor coupled to Out-l and an NMOS pass transistor coupled to Out-r. The gates of the pass transistors are coupled to the word line and the drains are coupled to the bit line. In this embodiment, the storage structure of the memory cell may be considered equivalent to a standard 6T SRAM memory cell.

Address decoder and control block 170 is configured to control internal signals of memory block 100. Address decoder and control sub-block 170 receives an address or range of addresses and optionally a requested operation (e.g., program, read, or verify). The address or addresses may be received from an external source. The input address signals identify the memory cell or cells to be programmed, read, or verified.

Row decoder 180 is coupled to memory array 130 and address decoder and control block 170. Row decoder 180 is configured to select one row at a time from memory array 130. Row decoder 180 receives a control signal from address decoder and control block 160. The control signal indicates the mode of operation (e.g., program, read, or verify) and the address or range of addresses to be selected. A row is selected by raising its row select line to a voltage high level (e.g., 5V).

Program column select 120 is configured to select one or more bit lines during programming operation. Program column select 120 is optional. Program column select 120 receives a control signal from address decoder and control block. The control signal includes the mode of operation (e.g., program) and the address or range of addresses of the cells to be programmed. Program column select 120 selects a column by raising its bit line to a voltage high level (e.g., 5V). Program column select 120 allows for a single cell or group of cells to be programmed. When not present, all columns are selected during a program operation. By selecting a single column at a time, the size of the charge pump required for the memory block 400 can be reduced.

Charge pump 110 is optional. When present, charge pump 110 generates a high voltage supply (approximately 5V) from a lower core voltage supply (e.g., 1.0V or 2.0V) for programming the memory cells. When not present, the high voltage is provided by an external supply. In an embodiment, charge pump 110 is coupled to one or more bit lines associated with columns in memory array 130 by program column select 120.

Memory block 100 includes one or more sense amplifiers 150. The number of sense amplifiers is dependent upon the implementation of the memory block. The number of sense amplifiers may be equal to or less than the number of columns in memory array 130. At least one sense amplifier 150 is needed to operate the system. In an embodiment, if there are sixteen columns of memory cells present in array 130, there can be a sense amplifier 150 coupled to each of the sixteen columns in array 130. In other words, because there are sixteen sense amplifiers 150, sixteen memory cells in the row can be read at one time.

Column multiplexer 140 is configured to select the bit lines to be coupled to sense amplifiers 150. Column multiplexer 140 is optional when present, column multiplexer 140 couples the bit lines for selected columns to sense amplifiers 150. Column multiplexer 140 allows for variable aspect ratios of the memory block, increasing the ease of floor planning at the chip level and improving performance of the memory block. For example, if memory block 100 has 16 output channels and 16 sense amplifiers 150, memory array 130 could be designed with 32 physical columns multiplexed to the 16 sense amplifiers via column multiplexer 140.

A sense amplifier 150 is coupled to reference block 160 and memory array 130. Each sense amplifier 150 is configured to sense the voltage of a bit line and compare the sensed voltage to a reference voltage provided by voltage reference generator 164. Sense amplifier 150 determines a state (e.g., programmed or unprogrammed) of the activated or enabled memory cell in array 130.

Reference block 160 includes a current reference generator 162 and a voltage reference generator 164. Current reference generator 162 provides a current to memory array 130 during verification mode. Voltage reference generator 164 provides a reference voltage to sense amplifiers 150. The reference voltage is designed to mimic the fuse device resistance.

2. Quad SRAM-Based One Time Programmable Memory Cell

Figure 3:
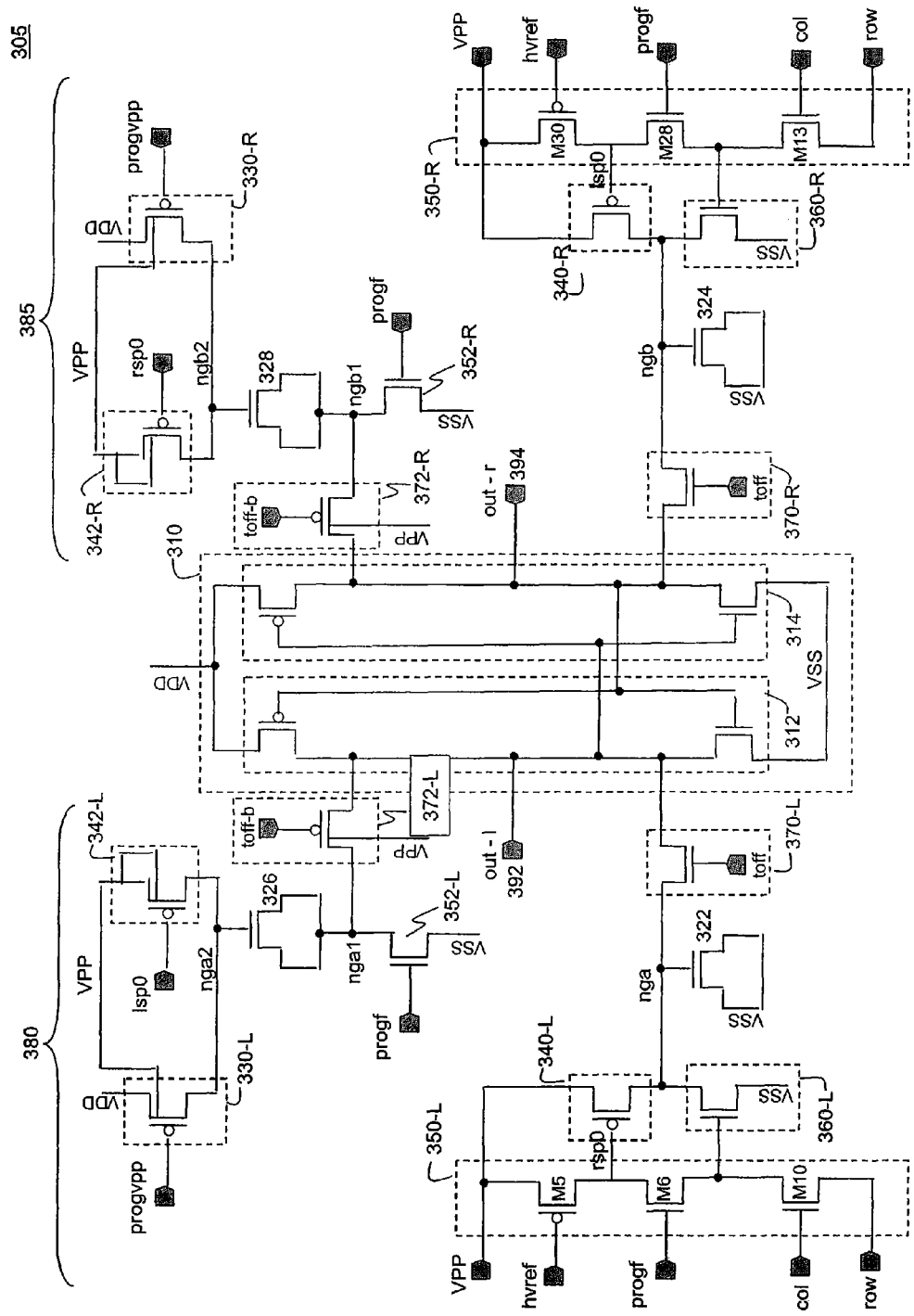
FIG. 3 depicts a SRAM-based OTP memory cell, according to embodiments of the present invention.

FIG. 3 depicts an exemplary SRAM-based OTP memory cell, according to embodiments of the present invention. OTP memory cell 300 includes a storage element 310, a left side structure 380, and a symmetric right side structure 385.

Figure 2:
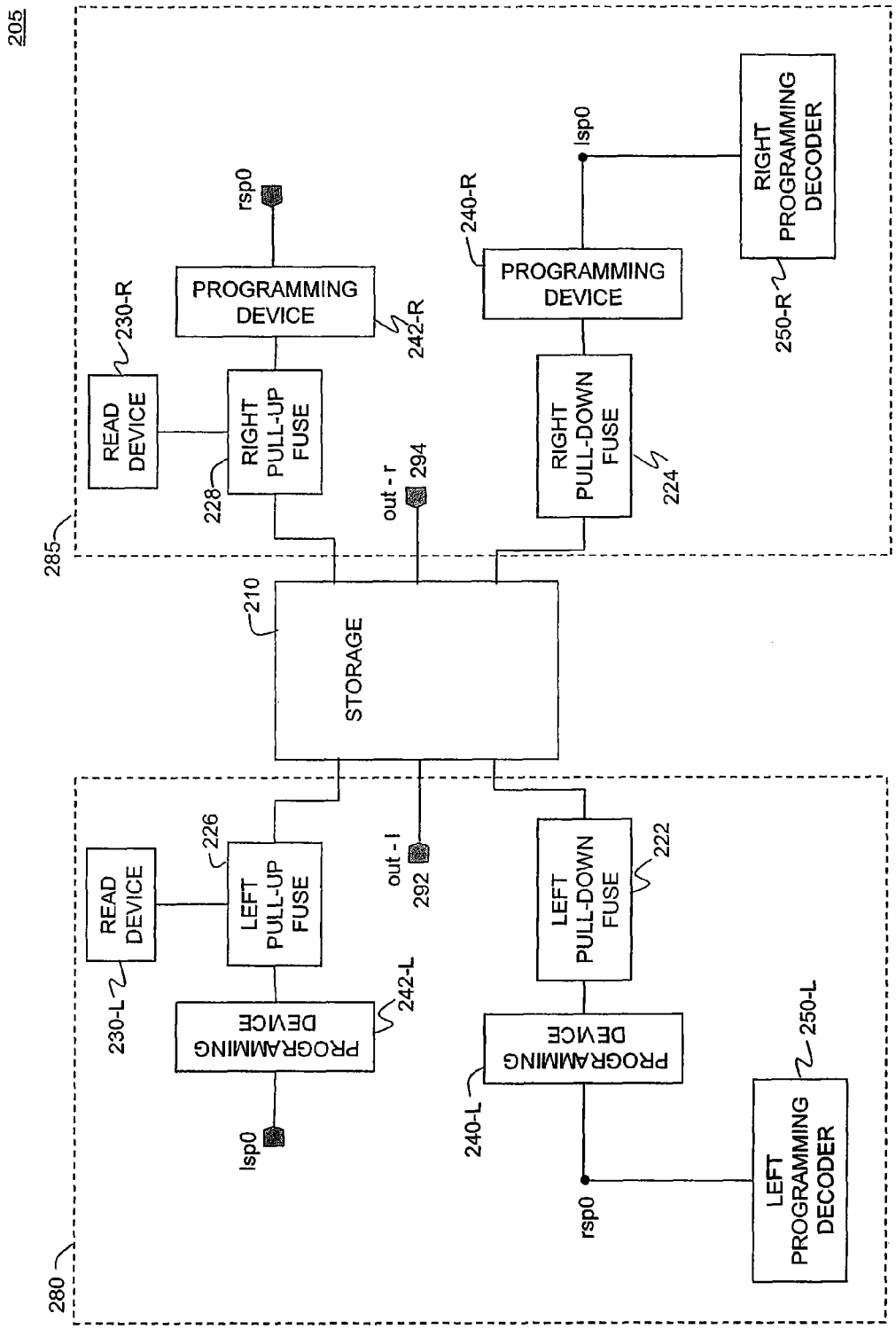
FIG. 2 depicts a block diagram of a typical differential latch based OTP memory cell used in non-volatile memory arrays.

As described above in FIG. 2, each side structure 480, 485 includes a read device 430-L, 430-R, a programming decoder 450-L, 450-R, a programming device 440-L, 440-R, an optional fuse buffer 460-L, 460-R, a latch buffer 470-L, 470-R, and a fuse block 420-L, 430-R.

Storage element 310 includes a set of fed back inverters 312, 314. Storage element 310 includes a first output, $out_l$ 392, and a second output, $out_r$ 394. Prior to programming OTP memory cell 300, the $out_l$ and $out_r$ nodes can be read or written to like an SRAM via any typical SRAM construct.

Memory cell 300 includes a lower left fuse 322, a lower right fuse 324, an upper left fuse 326, and an upper right fuse 328. A fuse may be a thin oxide MOS transistor including, but limited to, an NMOS transistor, a PMOS transistor, or an NMOS transistor with native $V_t$ implant. A fuse may also be a PMOS transistor. In alternative embodiments, a fuse may be a thin oxide capacitors such as a thin oxide NMOS capacitor or a thin oxide PMOS capacitor. An unprogrammed thin gate oxide fuse has a high resistance. A programmed thin gate oxide fuse (commonly referred to as a "blown" fuse) has a low resistance.

Lower left fuse 322 is coupled at its gate to node nga and at its source and drain to ground. Lower right fuse 324 is coupled at its gate to node ngb and at its source and drain to ground. Upper left fuse 326 is coupled at its gate to node nga2 and at its source and drain to node nga1. Upper right fuse 328 is coupled at its gate to node ngb2 and at its source and drain to node ngb1.

The state assigned to a memory cell may be determined by a specific application or implementation. For example, in an application, lower left fuse 322 and upper right fuse 328 are programmed to represent a logic "0" state, and lower right fuse 324 and upper left fuse 326 are programmed to represent a logic "1" state. When a logic "0" state is programmed, lower left fuse 322 operates as pull down device on $out_l$ node 392 and upper right fuse 328 operates as a pull up device on $out_r$ node 394. Conversely, when a logic "1" state is programmed, lower right fuse 324 operates as a pull down device on $out_r$ node 394 and upper left fuse 326 operates as a pull up device on $out_l$ node 392. Inverters 312 and 314 help to reinforce the set state.

Buffers 370-L and 370-R protect storage element 310 when lower left fuse 322 and/or lower right fuse 324 are being programmed. Buffers 370-L, 370-R are optional. In an embodiment, buffer 370-L includes an NMOS transistor coupled at its gate to a toff signal, at its drain to storage element 310, and at its source to node nga. Buffer 370-R includes an NMOS transistor coupled at its gate to the toff signal, at its drain to storage element 310, and at its source to node ngb. When one or more fuses are being programmed, toff is set to ground, isolating the storage element 310 from lower left fuse 322 and lower right fuse 324. When OTP memory is being read, toff is set to high to couple the lower left fuse 322 and lower right fuse 324 to storage element 310.

Similarly, buffers 372-L and 372-R protect storage element 310 when upper left fuse 326 and/or upper right fuse 328 are being programmed. Buffers 372-L, 372-R are optional. In an embodiment, buffer 372-L includes a PMOS transistor coupled at its gate to a toff-b signal, at its drain to storage element 310, and at its source to node nga1. The toff-b signal is the inversion of the toff signal. Buffer 372-R includes a PMOS transistor coupled at its gate to the toff-b signal, at its drain to storage element 310, and at its source to node ngb1. When one or more fuses are being programmed, toff-b is set to high, isolating the storage element 310 from upper left fuse 326 and upper right fuse 328. When OTP memory is being read, toff-b is set to ground to couple the upper left fuse 326 and upper right fuse 328 to storage element 310.

Programming decoder 350-L enables the programming of lower left fuse 322 and upper right fuse 328. Programming decoder 350-R enables the programming of lower right fuse 324 and upper left fuse 326. Programming decoder 350-L is coupled to lower left fuse 322 and to upper right fuse 328 via node rsp0. Programming decoder 350-R is coupled lower right fuse 324 and to upper left fuse 326 via node lsp0.

Programming decoder 350-L includes transistors M5, M6, and M10. In an embodiment, transistor M5 is a PMOS transistor and transistors M6 and M10 are NMOS transistors. In this embodiment, the gate of transistor M5 is coupled to a reference voltage input for the decoder (hvref), the source of transistor M5 is coupled to the programming voltage ($V_{PP}$), and the drain of transistor M5 is coupled to node rsp0. Node rsp0 is in turn coupled to lower left programming device 340-L and to upper right programming device 342-R. The gate of transistor M6 is tied to a fuse programming input (progf), the drain of transistor M6 is coupled to the drain of transistor M5, and the source of transistor M6 is coupled to fuse buffer 360-L and to the drain of select transistor M10. The gate of select transistor M10 is tied to a column select line (col-l), the source of transistor M10 is tied to a row select line (row-l), and the drain of select transistor M10 is coupled to fuse buffer 360-L. When OTP memory cell 300 is selected for programming the inputs of the programming decoder 350-L (col-l, row-l, hvref, and progf) are set such that the voltage level at node rsp0 is ground ($V_{SS}$).

Programming decoder 350-R includes transistors M30, M28, and M13. In an embodiment, transistor M30 is a PMOS transistor and transistors M28 and M13 are NMOS transistors. In this embodiment, the gate of transistor M30 is coupled to a reference voltage input for the decoder (hvref), the source of transistor M30 is coupled to the programming voltage ($V_{PP}$), and the drain of transistor M30 is coupled to node lsp0. Node lsp0 is in turn coupled to lower right programming device 340-R and to upper left programming device 342-L. The gate of transistor M28 is tied to a fuse programming input (progf), the drain of transistor M28 is coupled to the drain of transistor M30, and the source of transistor M28 is coupled to fuse buffer 360-R and to the drain of select transistor M13. The gate of select transistor M13 is tied to a column select line (col-r), the source of transistor M13 is tied to a row select line (row-r), and the drain of select transistor M13 is coupled to fuse buffer 360-L. When OTP memory cell 300 is selected for programming the inputs of the programming decoder 350-R (col-r, row-r, hvref, and progf) are set such that the voltage level at node lsp0 is ground ($V_{SS}$).

Select devices 352-L and 352-R enable the selection of upper left fuse 326 and upper right fuse 328 for programming. In an embodiment, select device 352-L is an NMOS transistor coupled at its gate to programming select signal (progf), at its drain to upper left fuse 326, and at its source to ground and select device 352-R is an NMOS transistor coupled at its gate to programming select signal (progf), at its drain to upper right fuse 328, and at its source to ground.

Programming devices 340-L, 340-R, 342-L, and 342-R provide programming current and voltage to their respective fuse 322, 324, 326, and 328 during programming operation. The programming devices also couple or decouple their respective fuse from the programming supply voltage ($V_{PP}$). When a programming decoder presents a voltage level of ground ($V_{SS}$) at the gate of a programming transistor, the transistor conducts, coupling the programming current and voltage to the gate of its associated fuse.

Programming device 340-L includes a transistor coupled at its gate to node rsp0 of programming decoder 350-L, at its drain to lower left fuse 322 (node nga), and at its source to programming voltage $V_{PP}$. Programming device 340-R includes a transistor coupled at its gate to node lsp0 of programming decoder 350-R, at its drain to lower right fuse 324 (node ngb), and at its source to programming voltage $V_{PP}$. Programming device 342-L includes a transistor coupled at its gate to node lsp0 of programming decoder 350-R, at its drain to upper left fuse 326 (node nga2), and at its source to programming voltage $V_{PP}$. Programming device 342-R includes a transistor coupled at its gate to node rsp0 of programming decoder 350-L, at its drain to upper right fuse 328 (node ngb2), and at its source to programming voltage $V_{PP}$. In an embodiment, the programming transistors are PMOS transistors.

Fuse buffer 360-L, 360-R protects the fuses when the fuses are not being programmed or read. Fuse buffer 360-L, 360-R are optional. Fuse buffer 360-L, 360-R includes a transistor coupled at its gate to programming decoder 350, at its source to ground, and at its drain to node nga, ngb. In an embodiment, fuse buffer 360-L, 360-R is a NMOS transistor. When activated, fuse buffer 360-L, 360-R sinks current, causing the nga, ngb node to go to ground. This prevents stress on fuses when the OTP memory cell is not selected for programming or reading.

Read device 330-L, 330-R provides read reference current for its respective side. Read device 330-L is a transistor coupled at its gate to a reference signal (progvpp), at its source to supply voltage VDD, and at its drain to node nga2 and upper right fuse 326. Read device 330-R is a transistor coupled at its gate to a reference signal (progvpp), at its source to supply voltage VDD, and at its drain to node ngb2 and upper left fuse 328. In an embodiment, read devices 330-L, 330-R are PMOS transistors.

3. System Operation

3.1 Pre-Programming Mode

Prior to programming the state of the SRAM-OTP memory cell, $out_l$ and $out_r$ are accessed via standard SRAM read and write circuits. To set of the state of SRAM structure, $out_l$ and $out_r$ are driven high or low.

3.2 Program Mode

Figure 4:
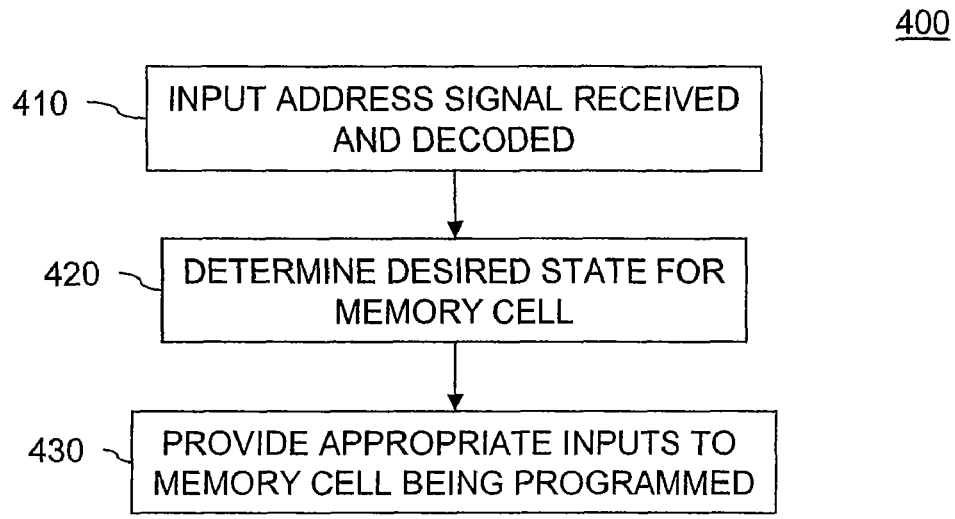
FIG. 4 depicts a flowchart of an exemplary method for programming an SRAM-OTP memory cell, according to embodiments of the present invention.

Program mode is used to program one or more memory cells in a memory array such as memory array 130 depicted in FIG. 1. FIG. 4 depicts a flowchart 400 of an exemplary method for programming an SRAM-OTP memory cell, according to embodiments of the present invention. Flowchart 400 is described with continued reference to the exemplary embodiments illustrated in FIGS. 1 and 3. However, flowchart 400 is not limited to those embodiments. Note that the steps of flowchart 400 do not necessarily have to occur in the order shown.

In step 410, an input address to be programmed is received by memory device 100 and decoded by address decode and control block 170, row decoder 180, and/or program column select block 120. As part of the decoding process, side (left or right), the row containing the memory cell to be programmed, and the column containing the memory cell to be programmed are identified.

In step 420, the desired state for the memory cell is determined. For example, if a state of logic "0" is to be set, lower left fuse 322 and upper right fuse 328 must be programmed. Alternatively, if a state of logic "1" is to be set, lower right fuse 324 and upper left fuse 326 must be programmed.

In step 430, the appropriate programming inputs are provided to the memory cell being programmed. The memory cell being programmed receives a number of inputs required to cause the memory cell to be properly programmed.

Inputs hvref, progf, col-l, and row-l are used to select or deselect decoder 350-L. For example, when decoder 350-L is selected, inputs hvref, progf, col-l, and row-l are configured to cause programming device 340-L to apply the programming voltage ($V_{PP}$) and programming current to lower left fuse 322 and to cause programming device 342-R to apply programming voltage ($V_{PP}$) and programming current to upper right fuse 322. In this example, input progf is set to high, coupling the source and drain of upper right fuse to ground. Because the source and drain of lower left fuse 322 and the source and drain of upper right fuse 328 are tied to ground, the fuses 322 and 328 see a high voltage between their gate and source. The voltage is sufficient to break down the thin gate oxide of the fuse (e.g., a voltage in the 3-5V range). When the oxide is broken down, a conductive path is formed between the gate and the source/drain regions of the transistor, programming the fuse.

Inputs toff and toff-b are used to isolate storage element 310 from the fuses during programming operation. In an embodiment, toff is set to ground and toff-b is set to high.

Inputs hvref, progf, col-r, and row-r are used to select or deselect decoder 350-R. For example, when decoder 350-R is selected, inputs hvref, progf, col-r, and row-r are configured to cause programming device 340-R to apply the programming voltage ($V_{PP}$) and programming current to lower right fuse 324 and to cause programming device 342-R to apply programming voltage ($V_{PP}$) and programming current to upper left fuse 326. In this example, input progf is set to high, coupling the source and drain of upper left fuse to ground. Because the source and drain of lower right fuse 324 and the source and drain of upper left fuse 326 are tied to ground, the fuses 324 and 326 see a high voltage between their gate and source. The voltage is sufficient to break down the thin gate oxide of the fuse (e.g., a voltage in the 3-5V range). When the oxide is broken down, a conductive path is formed between the gate and the source/drain regions of the transistor, programming the fuse.

3.2 Read Mode

Read mode is used to read the state of an SRAM-OTP memory cell in a memory array. This operation is typically, but not necessarily exclusively, performed after the OTP element memory core 105 has been programmed and verified.

Figure 5:
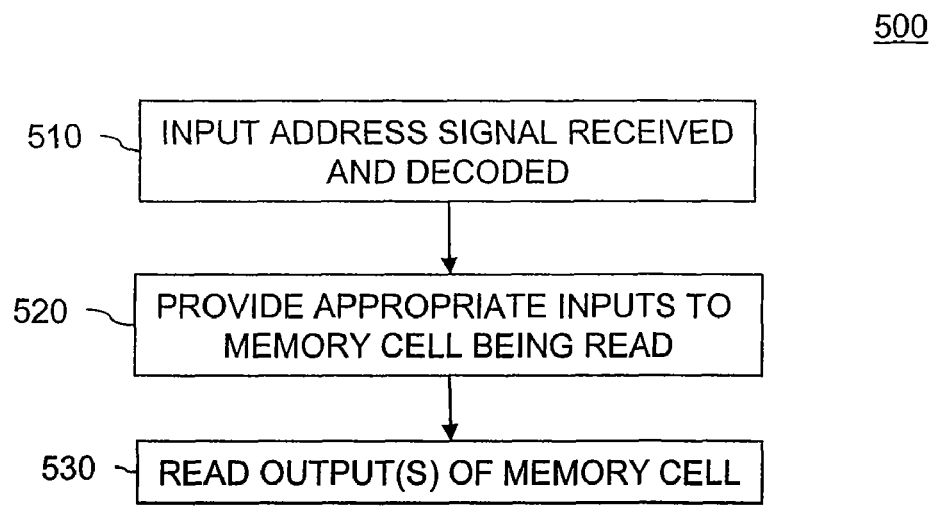
FIG. 5 depicts a flowchart of an exemplary method for reading an SRAM-OTP memory cell, according to embodiments of the present invention.

FIG. 5 depicts a flowchart 500 of an exemplary method for reading an SRAM-OTP memory cell, according to embodiments of the present invention. Flowchart 500 is described with continued reference to the exemplary embodiments illustrated in FIGS. 1 and 3. However, flowchart 500 is not limited to those embodiments. Note that the steps of flowchart 500 do not necessarily have to occur in the order shown.

In step 510, an input address to be read is received by memory device 100 and decoded by address decode and control block 170, row decoder 180, and/or program column select 120. As part of the decoding process, the row containing the memory cell to be read and the column containing the memory cell to be read are identified.

In step 520, the appropriate read inputs are provided to the memory cell being read. The memory cell being read receives a number of inputs required to cause the memory cell to be properly read.

Inputs toff and toff-b are used to couple fuses 322, 324, 326, and 328 to storage element 310. In an embodiment, toff is set to HIGH and toff-b is set to ground. The prog-vpp input is driven to ground to couple $V_{PP}$ to node nga and to couple $V_{PP}$ to node ngb. Inputs hvref, progf, col-l, and row-l are set to drive node rsp0 to $V_{PP}$. Inputs hvref, progf, col-r, and rol-r are set to drive node lsp0 to $V_{PP}$.

In step 530, the outputs of the SRAM-OTP memory structure 310 are read. As described above, SRAM-OTP memory structure 310 has a first output (out-l) and a second output (out-r). The values of out-l and out-r determine the state of the memory cell.

4. CONCLUSION

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

What is claimed is:

1. A one-time programmable memory cell, comprising:
a storage element having a first input, a second input opposite the first input, a first output, and a second output opposite the first output;
a voltage source;
a programming device;
a first fuse coupled in series with the programming device between the first input and the voltage source, wherein the first fuse, when programmed, acts as a pull-up device on the first output; and
a second fuse coupled to the second input, wherein the second fuse, when programmed, acts as a pull-up device on the second output.

2. The one-time programmable memory cell of claim 1, further comprising a read device coupled in parallel with the programming device.

3. The one-time programmable memory cell of claim 1, farther comprising a second programming device coupled in series with the second fuse between the second input and the voltage source.

4. The one-time programmable memory cell of claim 3, further comprising a second read device coupled in parallel with the second programming device.

5. The one-time programmable memory cell of claim 1, further comprising:
a third fuse, coupled to the first input, that, when programmed, acts a pull-down device on the first output; and
a fourth fuse, coupled to the second input, that, when programmed, acts a pull-down device on the second output.

6. The one-time programmable memory cell of claim 5, wherein when the first fuse and fourth fuse are programmed, the storage element outputs a first value during a read operation, and when the second fuse and third fuse are programmed, the storage element outputs a second value during the read operation.

7. The one-time programmable memory cell of claim 1, wherein the storage element operates as a static random access memory cell when the first fuse and the second fuse are not programmed.

8. The one-time programmable memory cell of claim 1, wherein the first fuse and the second fuse are thin-oxide MOS transistors.

9. The one-time programmable memory cell of claim 8, wherein at least one of the thin-oxide MOS transistors is an NMOS transistor.

10. The one-time programmable memory cell of claim 8, wherein at least one of the thin-oxide MOS transistors is an NMOS transistor with a native $V_T$ implant.

11. The one-time programmable memory cell of claim 8, wherein at least one of the thin-oxide MOS transistors is an NMOS transistor in $N_{WELL}$.

12. The one-time programmable memory cell of claim 8, wherein at least one of the thin-oxide MOS transistors is a PMOS transistor.

13. The one-time programmable memory cell of claim 5, further comprising:
   a first programming decoder coupled to the third fuse; and
   a second programming decoder coupled to the fourth fuse.

14. The one-time programmable memory cell of claim 1, wherein the storage element comprises:
   a first inverter coupled to the first fuse; and
   a second inverter coupled to the second fuse, wherein the first inverter and the second inverter are cross-coupled.

15. The one-time programmable memory cell of claim 1, further comprising:
   a buffer coupled between the first fuse and the first input.

16. The one-time programmable memory cell of claim 15, further comprising:
   a second voltage source; and
   a programming enable device coupled to the second voltage source.

17. A one-time programmable memory cell, comprising:
   a storage element having a first input, a second input, a first output, and a second output;
   a first fuse coupled to the first input, wherein the first fuse, when programmed, acts as a pull-up device on the first output; and
   a second fuse coupled to the second input, wherein the second fuse, when programmed, acts as a pull-up device on the second output,
   wherein the storage element, the first fuse, and the second fuse are configured to operate as a static random access memory when the first fuse and the second fuse are not programmed, and to operate as a one-time programmable memory after programming of at least one of the first fuse and the second fuse.

18. The one-time programmable memory cell of claim 17, wherein when the first fuse is programmed, the storage element outputs a first value during a read operation, and when the second fuse is programmed, the storage element outputs a second value during the read operation.

19. The one-time programmable memory cell of claim 17, further comprising:
   a third fuse, coupled to the first input, that, when programmed, acts a pull-down device on the first output; and
   a fourth fuse, coupled to the second input, that, when programmed, acts a pull-down device on the second output.

20. The one-time programmable memory cell of claim 17, wherein the storage element comprises:
   a first inverter coupled to the first fuse; and
   a second inverter coupled to the second fuse, wherein the first inverter and the second inverter are cross-coupled.

* * * * *

UNITED STATES PATENT AND TRADEMARK OFFICE
CERTIFICATE OF CORRECTION

PATENT NO. : 8,040,748 B2
APPLICATION NO. : 12/568430
DATED : October 18, 2011
INVENTOR(S) : Buer et al.

It is certified that error appears in the above-identified patent and that said Letters Patent is hereby corrected as shown below:

Column 8
Line 41, Claim 3, please replace "farther" with --further--.

Column 10
Line 21, Claim 19, please replace "acts a pull-down device" with --acts as a pull-down device--.

Column 10
Line 24, Claim 19, please replace "acts a pull-down device" with --acts as a pull-down device--.

Signed and Sealed this
Seventeenth Day of January, 2012

David J. Kappos
*Director of the United States Patent and Trademark Office*